United States Patent [19]
Penunuri

[11] Patent Number: 5,777,419
[45] Date of Patent: Jul. 7, 1998

[54] SURFACE ACOUSTIC WAVE DEVICE WITH MINIMIZED BULK SCATTERING

[75] Inventor: David Penunuri, Fountain Hills, Ariz.

[73] Assignee: Motorola Inc., Schaumburg, Ill.

[21] Appl. No.: 783,962

[22] Filed: Jan. 15, 1997

Related U.S. Application Data

[62] Division of Ser. No. 515,399, Aug. 15, 1995.

[51] Int. Cl.$^6$ .............................. H03H 9/72; H01L 41/08
[52] U.S. Cl. .................. 310/313 A; 310/360; 310/313 R
[58] Field of Search ........................... 310/313 A, 313 R, 310/360

[56] References Cited

U.S. PATENT DOCUMENTS

| | | | |
|---|---|---|---|
| 3,699,364 | 10/1972 | Gerard | 310/313 R |
| 3,725,827 | 4/1973 | Slobodnik | 310/313 R |
| 3,771,072 | 11/1973 | Slobodnik | 310/360 |
| 3,867,012 | 2/1975 | Phillips | 350/96 WG |
| 3,983,515 | 9/1976 | Mitchell et al. | 333/30 R |
| 4,001,767 | 1/1977 | Slobodnik, Jr. | 310/9.5 |
| 4,159,435 | 6/1979 | Lewis | 310/313 |
| 4,489,250 | 12/1984 | Ebata et al. | 310/313 A |
| 4,511,817 | 4/1985 | Chai et al. | 310/313 |
| 4,523,119 | 6/1985 | Whatmore | 310/313 A |
| 4,525,643 | 6/1985 | Chai et al. | 310/313 |
| 4,634,913 | 1/1987 | Whatmore et al. | 310/313 A |
| 4,670,680 | 6/1987 | Andle | 310/313 |
| 4,672,255 | 6/1987 | Suzuki et al. | 310/313 A |
| 4,853,019 | 8/1989 | Yamada et al. | 310/360 |
| 4,910,839 | 3/1990 | Wright | 29/25.35 |
| 5,081,389 | 1/1992 | Abbott et al. | 310/313 |
| 5,327,626 | 7/1994 | Cho et al. | 29/25.35 |
| 5,434,465 | 7/1995 | Sato et al. | 310/313 A |
| 5,434,466 | 7/1995 | Hickernell et al. | 310/313 D |
| 5,705,964 | 1/1998 | Tera et al. | 310/313 R |

FOREIGN PATENT DOCUMENTS

| | | | |
|---|---|---|---|
| 55-115711 | 9/1980 | Japan | 310/360 |
| 61-73409 | 4/1986 | Japan | 310/313 R |
| 61-82513 | 4/1986 | Japan | 310/313 A |
| 6164287 | 4/1993 | Japan | H03H 3/10 |
| 59-156013 | 9/1994 | Japan | 310/313 A |

OTHER PUBLICATIONS

"Propagation and Amplification of Rayleigh Waves and Piezoelectric Leaky Surface Waves in LiNbO$_3$," by Kazuhiko Yamanouchi and Kimio Shibayama, Research Institute of Electrical Communication, Tokoku University Sendai, Japan, (Aug. 1971).

An Article entitled "LiNbO Cuts for Filter Applications of 90°–Reflected Leaky Elastic Waves" from 1994 Mahk Hayka/Interperiodica Publishing by A.L Koslov.

An Article entitled "Substrate thickness dependence of SH wave propagation characteristics in rotated Y–cut X–propagation LiNbO$_3$" from 1986 Acoustical Society of America, Jan. 1986.

Hickernell, et al., The Surface Acoustic Wave Propagation Characteristics . . . , IEEE, pp. 1–4, Nov. 8, 1995.

*Primary Examiner*—Thomas M. Dougherty
*Attorney, Agent, or Firm*—Brian M. Mancini

[57] ABSTRACT

A piezoelectric substrate (120) and a method for preparing same. The method includes steps of (i) providing a boule of piezoelectric material, (ii) orienting the boule to Euler angles chosen to provide a boundary condition matched to a partially-metallized surface and (iii) sawing the boule into at least a first slice (120) having first and second surfaces, at least one of the first and second surfaces comprising a planar surface. The method desirably but not essentially further includes steps of (iv) polishing at least one of the first and second surfaces to provide a substantially planar polished surface, (v) disposing a layer of metal on the at least one of the first and second surfaces and (vi) patterning the layer of metal to provide at least one interdigitated pattern (105, 110) comprising an acoustic wave transducer (105, 110), the acoustic wave transducer (105,110) providing the boundary condition matched to a partially-metallized surface.

13 Claims, 6 Drawing Sheets

SURFACE ACOUSTIC WAVE DEVICE WITH MINIMIZED BULK SCATTERING

This application is a divion of Ser. No. 08/515,399, filed Aug. 15, 1995.

FIELD OF THE INVENTION

This invention relates in general to the field of frequency selection components, in particular to acoustic wave frequency selection components and more particularly to materials for, and devices incorporating, improved loss surface-skimming bulk acoustic wave frequency selection components and radio-frequency devices employing same.

BACKGROUND OF THE INVENTION

There is an ongoing need for acoustic wave filters and delay lines for a variety of practical applications. Acoustic wave devices are becoming particularly important in the production of electronic signal processing equipment, especially radios, because they can be readily mass produced and are of small size and also because of increased pressure to employ available radio spectrum efficiently. Acoustic wave devices are generally constructed on planar surfaces using techniques similar to those employed in manufacturing integrated circuits.

A number of low-loss acoustic wave filter and transducer design approaches including temperature compensation, broad bandwidth and improved out-of-band signal rejection have been developed to meet specific performance goals relevant to particular applications and subject to specified manufacturing constraints. These approaches include multiphase uni-directional acoustic wave transducers, multi-transducer acoustic wave filters, resonators, distributed acoustic reflection transducers (DARTs) and acoustic wave transducers backed by reflectors, with each acoustic device type providing filter performance strengths and weaknesses. Specific substrate orientations and materials have also been developed to provide improved acoustic wave propagation and transduction characteristics, including increased electromechanical coupling coefficients, decreased temperature sensitivity, decreased acoustic propagation loss, decreased design and fabrication sensitivity, as well as reduced complexity and other factors.

Examples of these and other types of acoustic wave device approaches including choices of substrate materials and orientations are described in "Propagation and Amplification of Rayleigh Waves and Piezoelectric Leaky Surface Waves in LiNbO$_3$," by K. Yamanouchi and K. Shibayama, J. App. Phys. Vol. 43, No. 3; U.S. Pat. Nos. 4,159,435, entitled "Acoustic Surface Wave Devices Employing Surface Skimming Bulk Waves", by M. F. Lewis; 4,489,250, entitled "Temperature Compensated Surface Acoustic Wave Device" by Y. Ebata et al.; 4,670,680, entitled "Doubly Rotated Orientations of Cut Angles For Quartz Crystal For Novel Surface Acoustic Wave Devices" by J. Andle; 4,525,643 and 4,511,817, entitled "Temperature Compensated Orientations of Berlinite for Surface Acoustic Wave Devices" by B. Chai et al.; and 4,001,767, entitled "Low Diffraction Loss-Low Spurious Response LiTaO$_3$ Substrate for Surface Acoustic Wave Devices" by A. Slobodnik, which are hereby incorporated herein by reference. However, these and other prior art approaches suffer from a number of disadvantages well known in the art. These disadvantages tend to become more serious as operating frequency increases.

Of particular interest are substrata supporting surface skimming bulk acoustic waves. These tend to provide increased electromechanical coupling coefficients, resulting in a desirable combination of insertion loss, out-of-band rejection, bandwidth and other characteristics. Moreover, the reduced sensitivity of device insertion loss to surface contamination as a result of the horizontally polarized particle motion associated with such waves potentially greatly simplifies device packaging and manufacturing constraints, encouraging reduced manufacturing costs, package footprint and weight and these trends are also consistent with increased robustness of acoustic wave devices including such substrata. As noted in FIG. 3 and associated text of Yamanouch (supra), losses due to scattering into bulk acoustic waves for Y-cut, rotated LiNbO$_3$ are a strong function of cut angle. Minima in these losses occur at different rotation angles depending on whether the substrate surface is open—or short-circuited. 41° and 64° rotated, y-cut LiNbO$_3$ substrata have minimum insertion losses for the open- and short-circuited cases, respectively. Because neither condition corresponds to that obtaining in an interdigitated transducer, some scattering of acoustic energy into other, undesired acoustic propagation modes, and hence some additional component or filter insertion loss, is noted in devices employing such transducers.

What are needed are substrata and frequency selection components, as well as methods for providing and using same, having the advantages of broad bandwidth and generally reduced insertion losses associated with surface skimming bulk waves (compared to other technologies) but with reduced insertion losses, especially those losses associated with acoustic propagation loss occurring in partially metallized regions such as acoustic wave transducers.

DETAILED DESCRIPTION OF THE DRAWINGS

Figure 1:
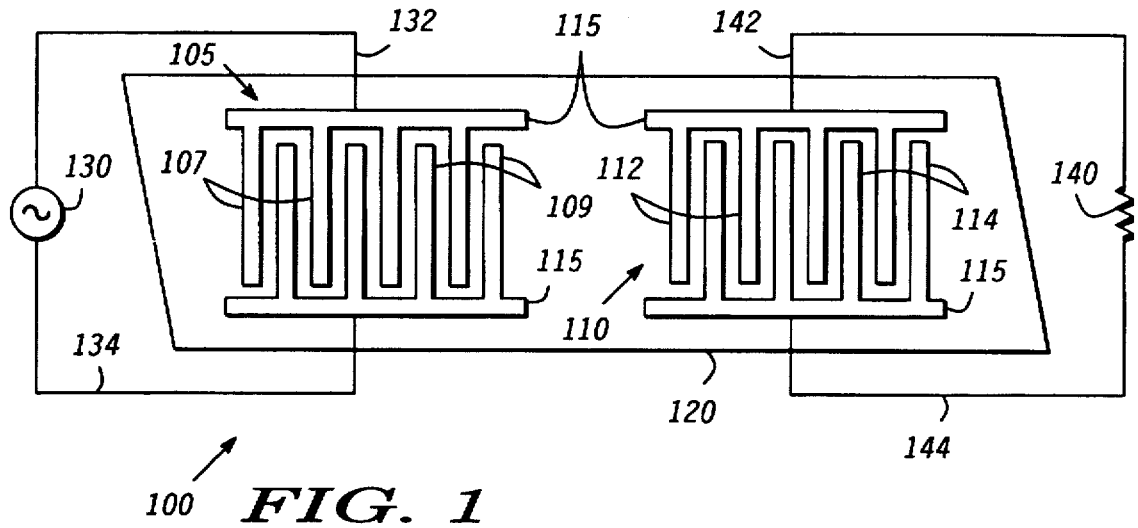
FIG. 1 is a simplified plan view of an acoustic wave filter in accordance with the present invention.

FIG. 1 is a simplified plan view of acoustic wave filter 100 in accordance with the present invention. Surface-skimming bulk waves, hereinafter termed "acoustic waves" for simplicity of explanation and ease of understanding, are generally acoustic propagation modes characterized by particle motions extending into the bulk (e.g., $x_3$, FIG. 2, infra) of acoustic-wave propagating substrate 120 by a distance often substantially greater than an acoustic wavelength but not necessarily approximating a plane wave and having a tendency to be at least loosely guided along a surface of the substrate. Such acoustic waves may have particle motions primarily characterized by shear displacements transverse to the direction of propagation of acoustic energy and in the plane of the substrate surface, as described, for example, in Yamanouchi (supra). These types of acoustic waves also often have very high electromechanical coupling coefficients but tend to include substantial acoustic losses at cut angles deviating from the optimum. Acoustic wave filter 100 usefully comprises acoustic substrate 120 and acoustic wave transducers 105 and 110 coupled to signal source 130 and load 140 via leads 132, 134 and 142, 144, respectively. Acoustic wave transducer 105 further comprises busses or bus bars 115 and comb electrodes 107 and 109. As employed herein, the term "partially metallized" is intended to refer to a region on the substrate surface including interdigitated electrodes (i.e., 107, 109) disposed in the acoustic propagation path and having a pitch or period that promotes electroacoustic interaction with the propagating acoustic wave. Acoustic wave transducer 110 further comprises busses 115 and comb electrodes 112 and 114. It will be appreciated that while acoustic wave filter 100 is illustrated as including two acoustic wave transducers 105 and 110, more or fewer transducers may be employed in a given frequency selection component design as required in order to address the specifications for the specific application.

Materials often employed for acoustic wave propagating substrate 120, many supporting surface skimming bulk waves, include lithium niobate (LiNbO$_3$) (see, e.g., U.S. Pat. No. 4,159,435, Lewis, supra), lithium tantalate (LiTaO$_3$) (see, e.g., U.S. Pat. No. 4,001,767, Slobodnik, supra), lithium tetraborate (Li$_2$B$_4$O$_7$) (see, e.g., U.S. Pat. No. 4,489,250, Ebata et al., supra), bismuth germanium oxide (BiGeO$_{20}$), bismuth silicon oxide (BiSiO$_{20}$), gallium arsenide (GaAs), cadmium sulfide (CdS), aluminum nitride (AlN), zinc oxide (ZnO), SiO$_2$ (quartz, see, e.g., U.S. Pat. No. 4,159,435, Lewis and U.S. Pat. No. 4,670,680, Andle, supra) and the like, shaped into thin plates or discs or layers having a highly polished surface and oriented to place a substrate surface into coincidence with a preferred crystallographic plane which includes a principal or preferred acoustic propagation direction. While stoichiometric chemical formulae are provided for the substances mentioned hereinabove, it should be understood that deviations from stoichiometry are common in various methods of substrate material preparation and that such variations are intended to be included in the descriptions of materials comprising substrate 120.

Acoustic wave transducers 105 and 110 convert electrical to acoustic energy and vice versa. Interdigitated comb electrodes 107, 109 and 112, 114 are interconnected by busses 115. Comb electrodes 107, 109, 112 and 114 and busses 115 are typically made of thin-film metal (e.g., aluminum and alloys thereof), deposited, for example, by vacuum evaporation or by RF sputter deposition, on the polished surface of acoustic wave propagating substrate 120 which is in whole or in part piezoelectric. Comb electrodes 107, 109, 112 and 114 and busses 115 making up acoustic wave transducers 105 and 110 are typically defined photolithographically, using processes similar to those used to manufacture integrated circuits, as is well known in the art.

Figure 2:
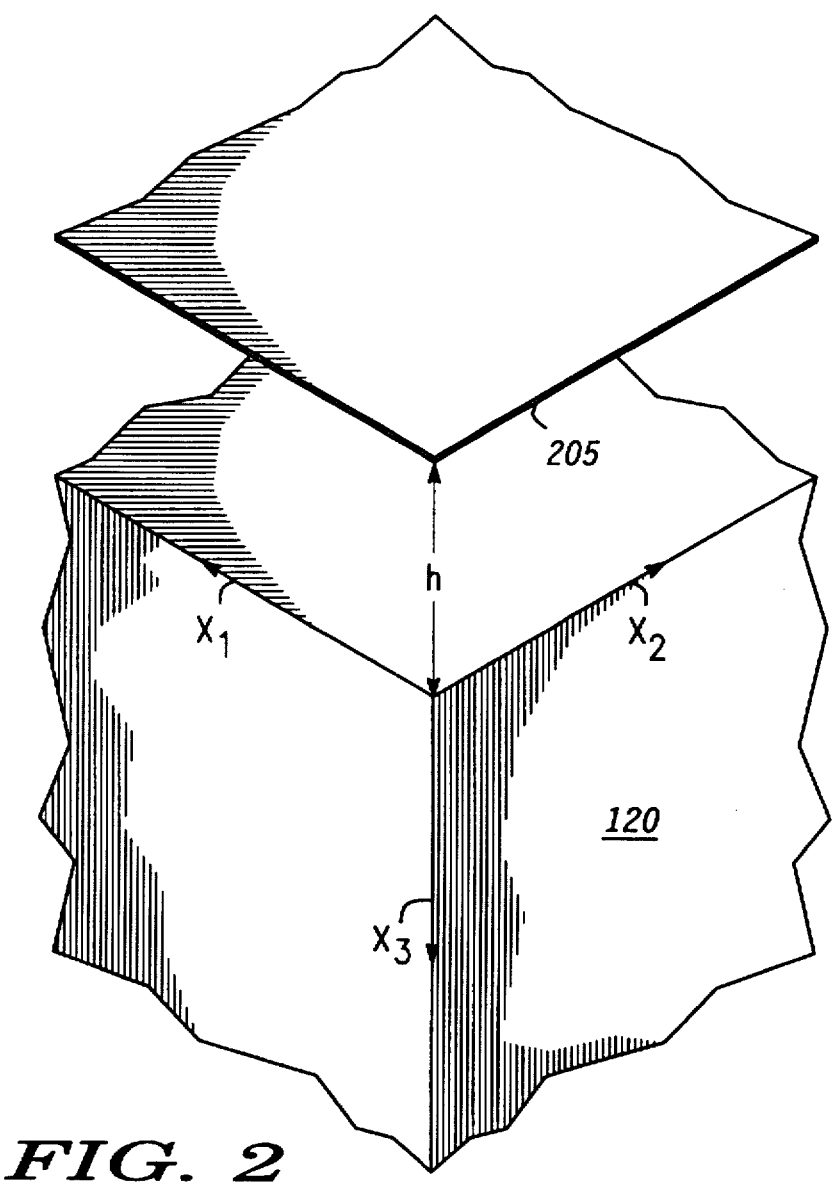
FIG. 2 illustrates a perfect electric conductor suspended a distance h above a surface of a substrate.

FIG. 2 illustrates perfect (i.e., not incurring mass or stiffness loading, or acoustic or resistive losses) electric conductor 205 suspended a distance h above a surface of substrate 120. An approach to determining preferred rotation angles (also known as "Euler angles") for acoustic wave substrata is described in terms of the geometry illustrated in FIG. 2, however, it will be understood that desirable results may be obtained through alternative characterization and emulation techniques.

A coordinate system $x_1$-$x_3$, illustrated in FIG. 2, allows calculation of acoustic wave and other properties of rotated materials as illustrated in U.S. Pat. Nos. 4,001,767, 4,159,435, 4,511,817, 4,525,643, 4,670,680 and 5,081,389 (supra) and discussed in the relevant literature. Variations of acoustic wave velocity for a chosen acoustic wave propagation mode are calculated for varying separations h, with h=0 corresponding to a shorted surface (e.g., 64° LiNbO$_3$) and h=infinite corresponding to an open-circuited surface (e.g., 41° LiNbO$_3$). These lead to a rational approximation (e.g., one polynomial divided by another) to acoustic wave velocity V versus scaled separation ωh, where ω is the well-known radian frequency, of:

$$V(\omega h)=4.47541+3.1\cdot\omega h/(1+11.28956\cdot\omega h). \quad (1)$$

Figure 4:
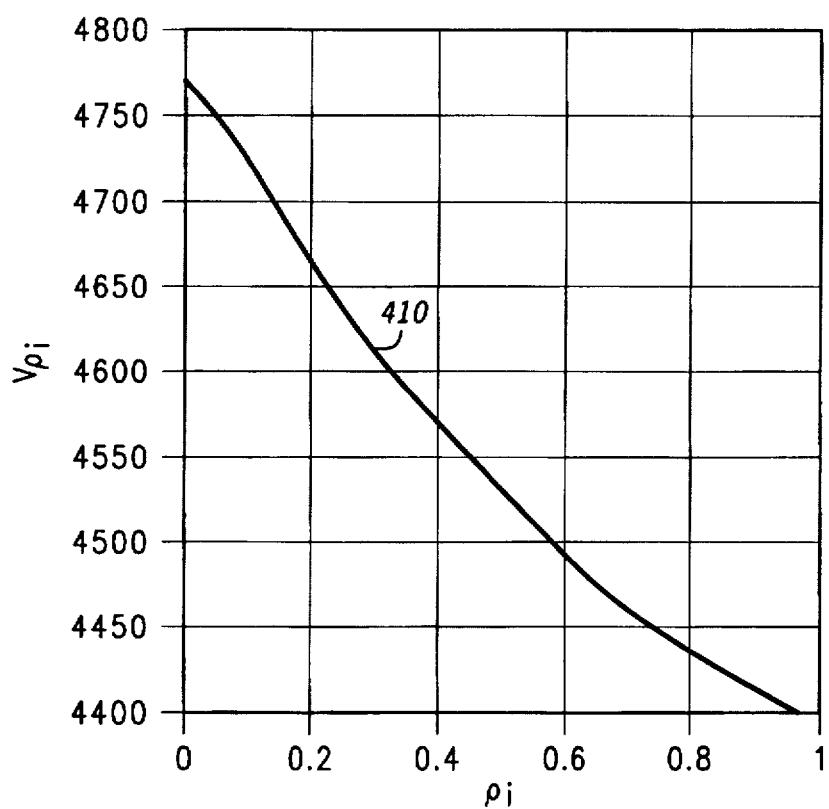
FIG. 4 is a graph of acoustic wave velocity versus metallization ratio $\rho_i$ on a surface of a LiNbO$_3$ substrate.

This result can be compared to experimentally-determined results by including the experimental influence of metal thickness (e.g., mass and stiffness loading) noted for the metal thickness employed in the experimental devices, as illustrated in FIG. 4. Estimation of conditions appropriate to mass-less shorting of the substrate surface is also useful for employing computer programs for modeling acoustic wave properties that do not include effects due to mass loading in estimating velocities and other propagation characteristics.

Figure 3:
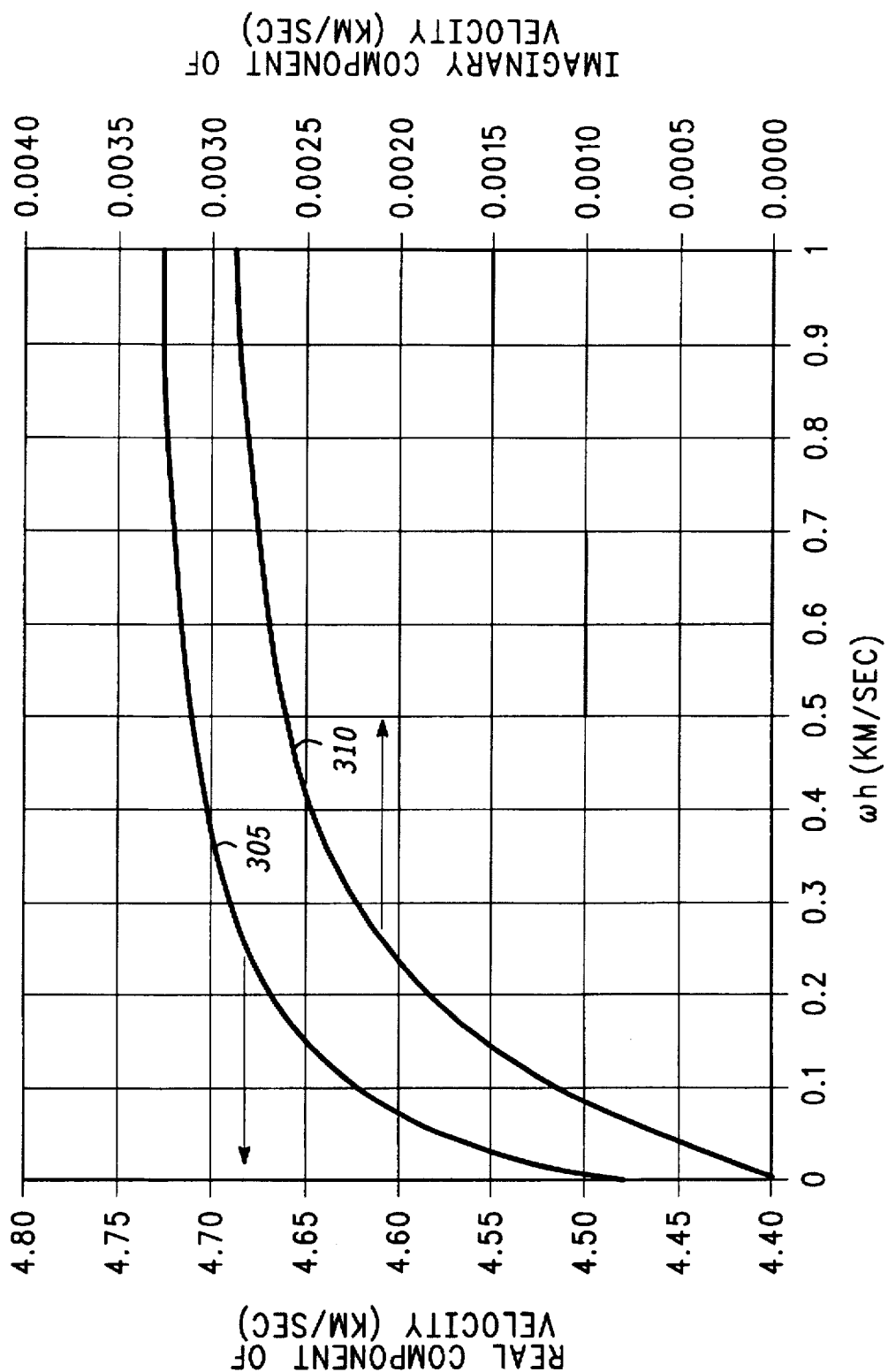
FIG. 3 is a graph of real and imaginary components of acoustic wave velocity versus shorting plane height above a surface of a LiNbO$_3$ substrate.

FIG. 3 is a graph of real (trace 305, corresponding to the left hand ordinal scale) and imaginary (trace 310, corresponding to the right hand ordinal scale) components of acoustic wave velocity versus scaled shorting plane height ωh above a surface of a LiNbO$_3$ substrate. Trace 310 shows that the complex velocity and particularly the imaginary component of velocity changes very rapidly as compared to the scaled shorting plane height ωh and quickly converges to the value for no shorting plane.

Figure 5:
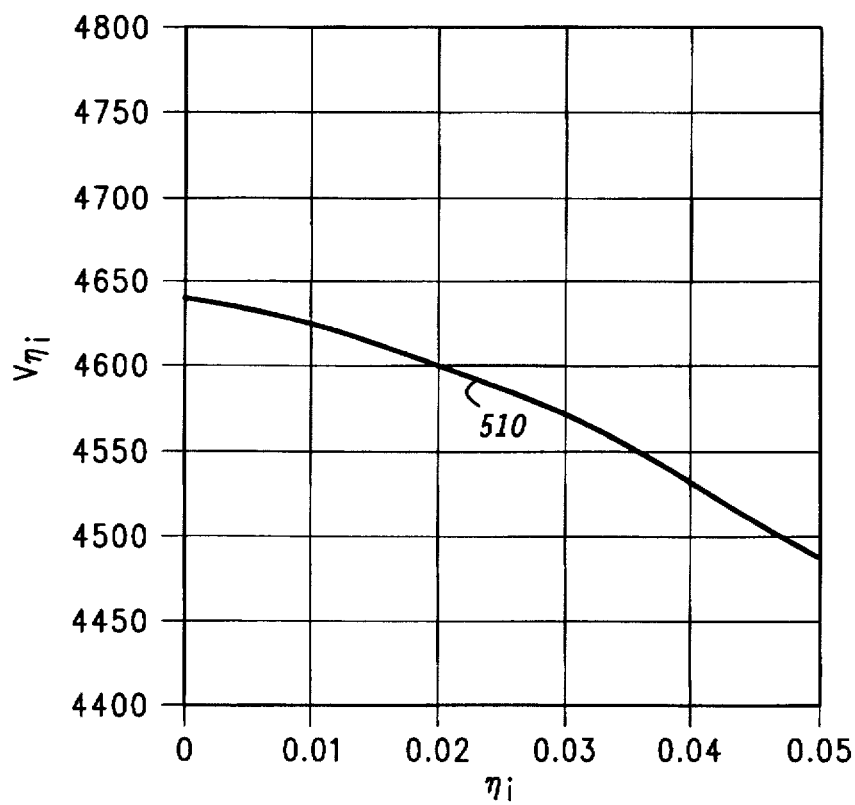
FIG. 5 is a graph of acoustic wave velocity versus metal thickness $\eta_i$ on a surface of a LiNbO$_3$ substrate.

FIG. 4 is a graph of acoustic wave velocity versus metallization ratio $\rho_i$ (trace 410) on a surface of a LiNbO$_3$ substrate, while FIG. 5 is a graph of acoustic wave velocity versus metal thickness $\eta_i$ (trace 510) on a surface of a LiNbO$_3$ substrate. These curves allow experimental data to be used to extrapolate $V(0, \rho_i)$ and to correct for experimentally-observed velocities $V(\eta_i, \rho_i)$ for experimental device metallization ratios while similar curves enable analogous calculations for other materials and orientations. These two velocities help to establish the range of velocities that might be encountered in practice and allow results obtained from leaky wave models that do not take mass loading into account to be extrapolated to correspond to measured data and vice versa. The low or zero attenuation cut determined from $V(\eta_i, \rho_i)$ is also expected to exhibit low attenuation with mass loading. For example, using Eq. (1) and the data provided earlier yields a corresponding value of ωh=0.0266 km/sec and provides a measure of the effective electrical boundary conditions associated with the acoustic wave transducer used in the experiment. This value of ωh corresponds to a non-zero imaginary value for the acoustic velocity. Holding the value ωh constant and searching for a value of cut angle that drives the imaginary part to a local minimum or zero provides the desired result, consistent with the boundary conditions associated with the presence of an acoustic wave transducer.

Figure 6:
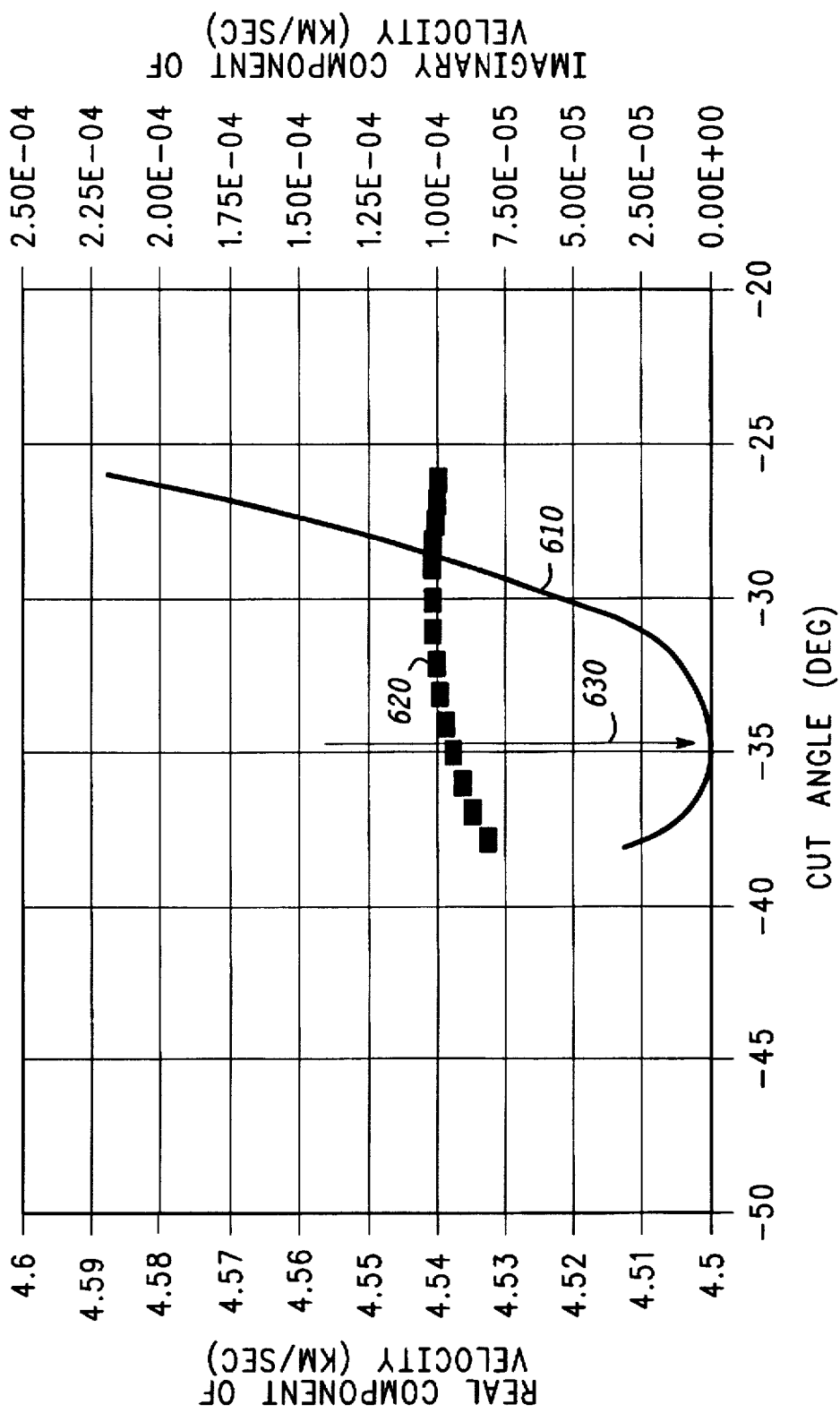
FIG. 6 is graph of real and imaginary components of acoustic wave velocity versus cut angle on a y-cut, rotated surface of a LiNbO$_3$ substrate in accordance with the present invention.

FIG. 6 is graph of real (trace 620, corresponding to the left hand ordinal scale) and imaginary (trace 610, corresponding to the right hand ordinal scale) components of acoustic wave velocity versus cut angle on a y-cut, rotated surface of a LiNbO$_3$ substrate versus rotation angle in accordance with the present invention and the methods described in association with FIGS. 3–5. Trace 620 shows relatively slow variation of the real component of acoustic wave velocity versus cut angle while trace 610 shows a local minimum at an angle denoted by arrow 630 corresponding to zero attenuation due to scattering into other acoustic propagation modes at a rotation angle of 55.5° from the crystallographic Y axis (i.e., rotation about the x$_1$ axis, see FIG. 2, supra) and corresponds to Euler angles of (0, −34.5, 0) (relative to FIG. 2). Similar calculations for ωh=0 yield an angle of 64° from the crystallographic Y axis, in agreement with results reported by Yamanouchi (supra) and others. These approximations, experimental errors and other factors (e.g., desired temperature range of operation, experimental temperature, stress in the substrate, substrate stoichiometry and the like) give rise to a range of cut angles near those calculated here and having useful and/or desirable properties that may actually be preferable for some needs. For example, in one application cut angles (i.e., surface normal of the slice or wafer from the crystallographic Y axis) of 47.5° to 63.5° or 42° to 50° might be preferred; in another, angles in a range of from 50° to 60° may be desirable; while for other applications an angle of 55.5° (corresponding to Euler angles of (0, −34.5°, 0) is useful.

Figure 7:
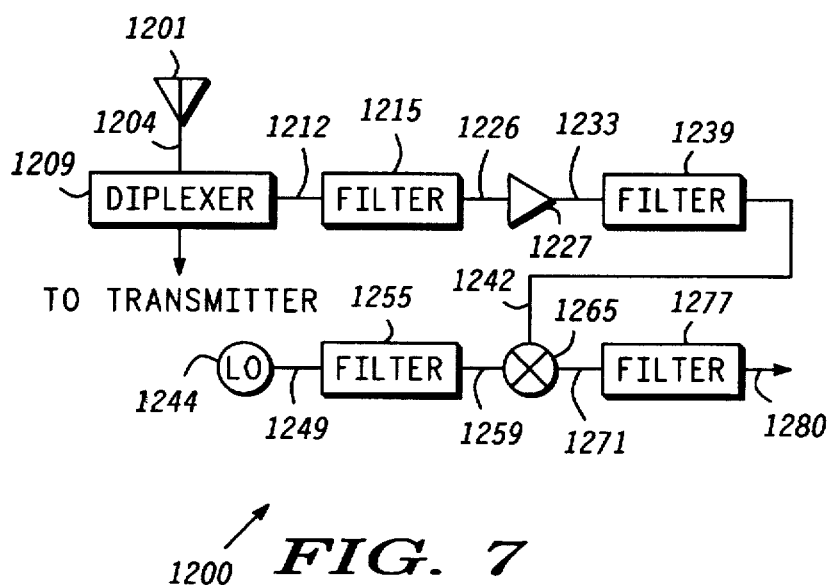
FIG. 7 is a block diagram of a portion of a radio frequency apparatus including acoustic wave filters in accordance with the present inventions

FIG. 7 is a block diagram of portion 1200 of a radio or other communications apparatus including one or more acoustic wave filters in accordance with the present invention. Apparatus 1200 includes antenna 1201 and antenna lead 1204, by way of example, used to receive and/or transmit signals.

Alternatively, antenna 1201 and antenna lead 1204 could be replaced by a fiber-optic link or a cable or other signal transmissive media. Diplexer 1209 is coupled to antenna 1201 and antenna lead 1204 and to a transmitter portion (not shown). Diplexer 1209 couples received signals to filter 1215 via lead 1212. Filter 1215 is coupled to amplifier 1227 via lead 1226.

The output of amplifier 1227 is coupled to filter 1239 via lead 1233. Filter 1239 couples its output signal to mixer 1265 where the signal coupled by lead 1242 is combined with another signal from local oscillator 1244 coupled via filter 1255 and leads 1249 and 1259. The signal which is output from mixer 1265 via lead 1271 is then passed through filter 1277 to provide an intermediate frequency or IF output signal via lead 1280.

Diplexer 1209, filter 1215, filter 1239, filter 1255 and/or filter 1277 may comprise acoustic wave filters according to the present invention.

Figure 8:
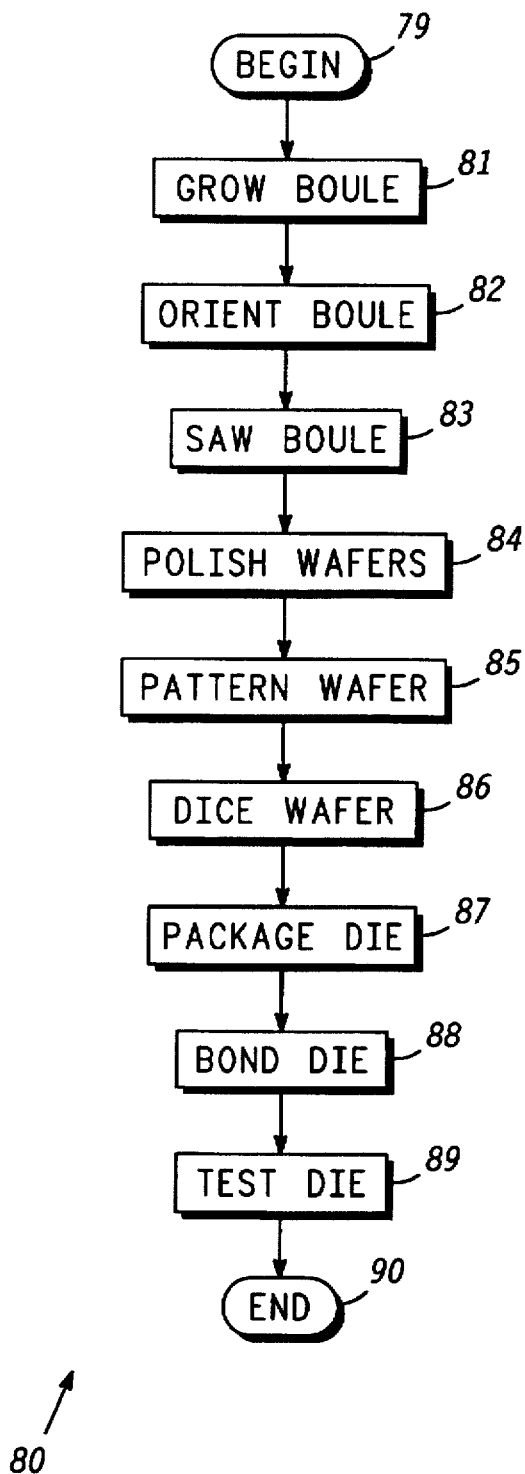
FIG. 8 is a flowchart describing steps in wafer preparation.

FIG. 8 is a flowchart describing method 80 for piezoelectric substrata preparation. Process 80 begins (block 79) with steps of (i) growing (block 81) a boule of an acoustic wave propagating material, often desirably a piezoelectric material, (ii) orienting (block 82) the boule to Euler angles chosen to provide desired properties such as a boundary condition matched to a partially-metallized surface, (iii) sawing (block 83) the boule into "slices" or "wafers" having first and second generally planar surfaces, usually parallel to each other and (iv) polishing (block 84) at least one of said first and second surfaces to provide a substantially planar polished surface. These steps are followed by steps of (v) patterning (block 85) by photolithographic and other steps to provide patterned wafers, which are then (vi) sawn or "diced" (block 86) into individual components for (vii) packaging (block 87), (viii) bonding (block 88) of electrical interconnections and (ix) testing (block 89) and subsequent delivery to end users. Process 80 then ends (block 90).

It will be appreciated by those of skill in the relevant arts that Euler angles are not necessarily unique, i.e., more than one set of Euler angles may correspond to equivalent orientations of material. Moreover, Euler angles depend on the initial choice of coordinate system and are one method of specifying orientation of materials having anisotropic physical properties. A second method for specifying such orientations is to specify them relative to a crystallographic orientation. Either method may be employed and equivalence between the two systems will be understood by those skilled in the relevant arts.

Thus, an acoustic wave substrate having a minimum of acoustic propagation loss for a partially-metallized condition versus rotation angle and method for determining such substrata have been described which overcome specific problems and accomplish certain advantages relative to prior art methods and mechanisms. The improvements over known technology are significant. The expense, complexities and insertion loss disadvantages of prior art approaches are reduced or avoided. Similarly, use of horizontally-polarized shear modes encourages reduced packaging demands and provides for increasingly robust devices such as acoustic wave filters.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

I claim:

1. A surface acoustic wave device with reduced bulk acoustic wave scattering, comprising:

a piezoelectric substrate having a first substantially planar surface oriented to Euler angles chosen to provide boundary conditions matched to a partially-metallized surface so as to minimize an imaginary acoustic wave velocity of an acoustic wave propagating in the substrate; and a transducer with interdigitated electrodes disposed on the substrate in line with a direction of acoustic wave propagation.

2. The surface acoustic wave device of claim 1, wherein said first substantially planar surface is a polished surface, and the transducer providing said boundary condition matched to a partially-metallized surface.

3. The surface acoustic wave device of claim 1, wherein said piezoelectric substrate comprises lithium niobate and is oriented to have a surface normal chosen from one of the set of angle ranges consisting of 47.5 to 63.5 and 42 to 50 degrees from a crystallographic Y axis.

4. The surface acoustic wave device of claim 1, wherein said piezoelectric substrate comprises material chosen from the group consisting of lithium niobate, lithium tetraborate, lithium tantalate, aluminum phosphate and quartz.

5. The surface acoustic wave device of claim 1, wherein:
said first substantially planar surface is a polished surface; and said the piezoelectric substrate is oriented to have a surface normal chosen from the set of angles consisting of 50 to 60 degrees from a crystallographic Y axis.

6. The surface acoustic wave device of claim 5, wherein said piezoelectric substrate comprises lithium niobate oriented to Euler angles of (0, −34.5, 0).

7. The surface acoustic wave device of claim 5, further comprising a second acoustic wave transducer disposed on said first substantially planar polished surface, said second acoustic wave transducer acoustically coupled to said first acoustic wave transducer in line with a direction of acoustic wave propagation to provide an acoustic wave filter.

8. The surface acoustic wave device of claim 6, further comprising a second acoustic wave transducer disposed on said first substantially planar surface, said second acoustic wave transducer acoustically coupled to said first acoustic wave transducer in line with a direction of acoustic wave propagation to provide an acoustic wave filter.

9. A surface acoustic wave device with reduced bulk acoustic wave scattering, comprising:

a piezoelectric substrate having a first surface, said first surface being substantially planar, said first surface is oriented to Euler angles chosen to provide boundary conditions matched to a partially-metallized surface so as to minimize an imaginary acoustic wave velocity of an acoustic wave propagating in the substrate, said Euler angles determined by extrapolating an acoustic wave velocity, measured for an acoustic wave propagating in a partially metallized region having a known metallization ratio and for a substrate having a known orientation and a known acoustic loss for at least one of the conditions chosen from a set consisting of an open-circuited condition and a short-circuited condition, wherein members of said set consist of orientations associated with minima in acoustic loss by scattering of acoustic waves into bulk acoustic modes, and varying an orientation angle of a substrate and calculating complex acoustic wave velocities to determine said Euler angles corresponding to a local minimum in an imaginary component of said complex acoustic wave velocity; and a transducer with interdigitated electrodes disposed on the substrate in line with a direction of the acoustic wave propagation.

10. The surface acoustic wave device of claim 9, wherein said piezoelectric substrate comprises material chosen from the group consisting of lithium niobate, lithium tetraborate, lithium tantalate, aluminum phosphate and quartz.

11. The surface acoustic wave device of claim 9, wherein said first surface is a polished surface, and said transducer providing said boundary condition matched to a partially-metallized surface.

12. The surface acoustic wave device of claim 11, wherein said piezoelectric substrate comprises lithium niobate; and said piezoelectric substrate is oriented to have a surface normal chosen from one of the set of angle ranges consisting of 47.5 to 63.5 and 42 to 50 degrees from the crystallographic Y axis.

13. In a radio, a surface acoustic wave device with reduced bulk acoustic wave scattering, comprising:

a piezoelectric substrate comprising lithium niobate and having a first surface oriented to Euler angles chosen to provide boundary conditions matched to a partially-metallized surface so as to minimize an imaginary acoustic wave velocity of an acoustic wave propagating in the substrate, wherein said first surface is a substantially planar polished surface; and an acoustic wave transducer with interdigitated electrodes disposed on said first surface in line with a direction of acoustic wave propagation, said acoustic wave transducer providing said boundary condition matched to a partially-metallized surface, wherein said piezoelectric substrate is oriented to have a surface normal chosen from the set of angles consisting of 50 to 60 degrees from the crystallographic Y axis.

\* \* \* \* \*